US009601487B2

(12) United States Patent
Tegen (10) Patent No.: US 9,601,487 B2
(45) Date of Patent: Mar. 21, 2017

(54) POWER TRANSISTOR (71) Applicant: Infineon Technologies Dresden GmbH, Dresden (DE)

(72) Inventor: Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/954,865

(22) Filed: Nov. 30, 2015

(65) Prior Publication Data

US 2016/0093615 A1 Mar. 31, 2016

Related U.S. Application Data (63) Continuation of application No. 13/961,666, filed on Aug. 7, 2013, now Pat. No. 9,209,248.

(51) Int. Cl.
*H01L 29/04* (2006.01)
*H01L 29/06* (2006.01)
*H01L 29/423* (2006.01)
*H01L 29/417* (2006.01)
*H01L 29/08* (2006.01)
*H01L 29/78* (2006.01)
*H01L 29/10* (2006.01)
*H01L 27/088* (2006.01)

(52) U.S. Cl.
CPC .......... *H01L 27/0886* (2013.01); *H01L 29/04* (2013.01); *H01L 29/0696* (2013.01); *H01L 29/0847* (2013.01); *H01L 29/1033* (2013.01); *H01L 29/41783* (2013.01); *H01L 29/41791* (2013.01); *H01L 29/4236* (2013.01); *H01L 29/78* (2013.01); *H01L 29/785* (2013.01); *H01L 29/7831* (2013.01)

(58) Field of Classification Search
None
See application file for complete search history.

(56) References Cited

U.S. PATENT DOCUMENTS

| 6,720,619 | B1 | 4/2004 | Chen et al. |
| 7,211,860 | B2 | 5/2007 | Zundel et al. |
| 7,629,651 | B2 * | 12/2009 | Nakajima ........... H01L 29/7841 257/347 |

(Continued)

FOREIGN PATENT DOCUMENTS

CN 1507064 A 6/2004

*Primary Examiner* — Michael Lebentritt
*Assistant Examiner* — Jordan Klein
(74) *Attorney, Agent, or Firm* — Slater Matsil, LLP (57) ABSTRACT A power transistor includes a number of transistor cells. Each transistor cell includes a source region, a drain region, a body region and a gate electrode. Each source region is arranged in a first semiconductor fin of a semiconductor body. Each drain region is at least partially arranged in a second semiconductor fin of the semiconductor body. The second semiconductor fin is spaced from the first semiconductor fin in a first horizontal direction of the semiconductor body. Each gate electrode is arranged in a trench adjacent the first semiconductor fin, is adjacent the body region, and is dielectrically insulated from the body region by a gate dielectric. Each of the first and second semiconductor fins has a width in the first horizontal direction and a length in a second horizontal direction, wherein the length is larger than the width.

31 Claims, 4 Drawing Sheets (56) References Cited

U.S. PATENT DOCUMENTS

| | | | |
|---|---|---|---|
| 8,455,948 B2* | 6/2013 | Weis | H01L 21/823418 257/194 |
| 2001/0040273 A1* | 11/2001 | Hueting | H01L 21/823418 257/623 |
| 2004/0108523 A1 | 6/2004 | Chen et al. | |
| 2007/0210383 A1* | 9/2007 | Nakajima | H01L 27/108 257/353 |
| 2012/0175635 A1* | 7/2012 | Weis | H01L 27/0623 257/77 |
| 2012/0292665 A1 | 11/2012 | Mariono et al. | |
| 2013/0193525 A1* | 8/2013 | Weis | H03K 17/063 257/379 |
| 2013/0307513 A1 | 11/2013 | Then et al. | |

* cited by examiner

POWER TRANSISTOR

This application is a continuation of U.S. application Ser. No. 13/961,666, filed on Aug. 7, 2013, which application is hereby incorporated herein by reference in its entirety.

TECHNICAL FIELD

Embodiments of the present invention relate to a power transistor, such as a power field-effect transistor.

BACKGROUND

Power transistors, in particular power field-effect transistors, such as power MOSFETs (Metal Oxide Field-Effect Transistors) or power IGBTs (Insulated Gate Bipolar Transistors) are widely used as electronic switches in drive applications, such as motor drive applications, or power conversion applications, such as AC/DC converters, DC/AC converters, or DC/DC converters.

There is a need to provide a power transistor that is capable of blocking a high voltage and that has a low specific on-resistance (the on-resistance multiplied with the semiconductor area (chip size) of the power transistor).

SUMMARY

A first embodiment relates to a power transistor. The power transistor includes a semiconductor body including a plurality of semiconductor fins that are spaced in a first lateral direction of the semiconductor body. A semiconductor layer adjoins the semiconductor fins in a vertical direction of the semiconductor body. The plurality of semiconductor fins includes a first group of first semiconductor fins and a second group of second semiconductor fins. The power transistor further includes a plurality of source regions, drain regions, body regions and gate electrodes. Each source region is at least partially arranged in one semiconductor fin of the first group. Each drain region is at least partially arranged in one semiconductor fin of the second group. Each body region is arranged between one of the plurality of source regions and one of the plurality of drain regions. Each gate electrode is arranged in a corresponding trench adjacent one of the plurality of first semiconductor fins, is adjacent one of the plurality of body regions, and is dielectrically insulated from the one of the plurality of body regions by a gate dielectric. A source node is electrically coupled to each of the source regions, a drain node is electrically coupled to each of the drain regions, and a gate node is electrically coupled to each of the gate electrodes.

A second embodiment relates to a power transistor. The power transistor includes a plurality of transistor cells. Each of the plurality of transistor cells includes a source region at least partially arranged in a first semiconductor fin of a semiconductor body and a drain region at least partially arranged in a second semiconductor fin of the semiconductor body. The second semiconductor fin is spaced from the first semiconductor fin in a first horizontal direction of the semiconductor body. A body region is arranged between the source region and the drain region. A gate electrode is arranged in a trench adjacent the first semiconductor fin is adjacent the body region and is dielectrically insulated from the body region by a gate dielectric. Each of the first and second semiconductor fins has a width in the first horizontal direction and a length in a second horizontal direction, wherein the length is larger than the width.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

DETAILED DESCRIPTION OF ILLUSTRATIVE EMBODIMENTS

Figure 1:
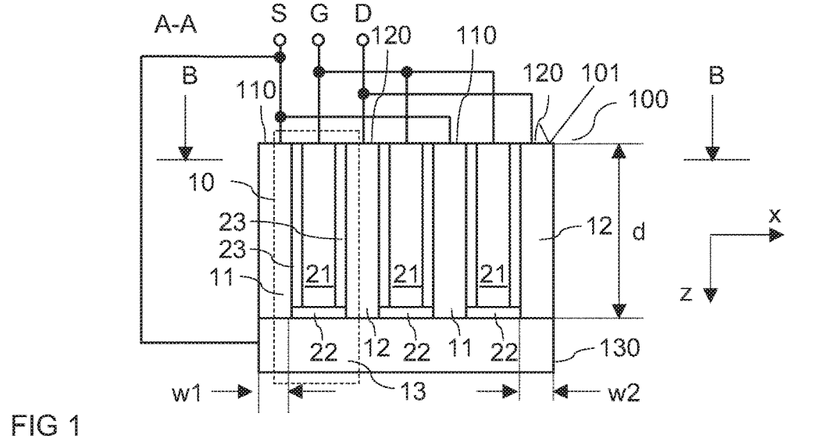
FIG. 1 illustrates a vertical cross sectional view of a power transistor according to one embodiment.
Figure 2:
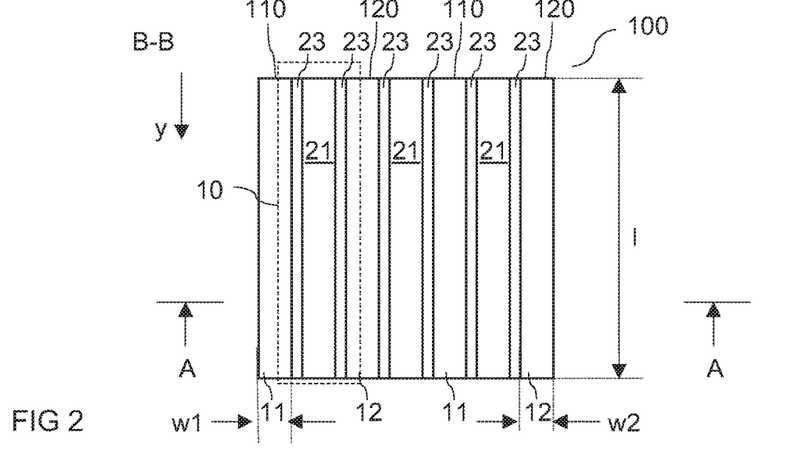
FIG. 2 illustrates a horizontal cross sectional view of the power transistor shown in FIG. 1.

FIGS. 1 and 2 illustrate a power transistor according to one embodiment. FIG. 1 shows a vertical cross sectional view of a portion of a semiconductor body 100 in which active device regions of the power transistor are integrated, and FIG. 2 shows a horizontal cross sectional view of the semiconductor body 100 in a section plane B-B the position of which is indicated in FIG. 1. Referring to FIGS. 1 and 2, the power transistor includes a plurality of substantially identical transistor cells 10 (only one of these transistor cell is labeled with a reference character in FIGS. 1 and 2). Each transistor cell 10 includes a source region 11 in a first semiconductor fin 110 of the semiconductor body 100, a drain region 12 at least partially arranged in a second semiconductor fin 120 of the semiconductor body 100, and a body region 13 arranged between the source region 11 and the drain region 12. The second semiconductor fin 120 is spaced from the first semiconductor fin 110 in a first horizontal direction x of the semiconductor body 100. Each transistor cell 10 further includes a gate electrode 21. The gate electrode 21 is arranged in a trench adjacent the first semiconductor fin 110, is adjacent the body region 13, and is dielectrically insulated from the body region 13 by a gate dielectric 22. Further, each of the first and second semiconductor fins 110, 120 has a width w1, w2 in the first horizontal direction x and, referring to FIG. 2, a length l in a second horizontal direction y of the semiconductor body 100. The second direction y is substantially perpendicular to the first direction x. The length 1 of each of the first and second semiconductor fins 110, 120 is larger than the width w1 and w2, respectively.

According to one embodiment, the width w1 of the first semiconductor fin 110 is substantially equal the width w2 of the second semiconductor fin 120, that is w1=w2. According to a further embodiment, the second semiconductor fin 120, in which the drain region 12 is integrated, is broader (has a larger width) than the first semiconductor fin 110, in which the source region 11 is integrated. According to one embodiment, a ratio w2/w1 between the width w2 of the second semiconductor fin 120 and the width w1 of the first semiconductor fin 110 is at least 1.5, at least 2, at least 5, or even at least 10.

A ratio between the length 1 of one of the first and second semiconductor fins 110, 120 and the corresponding width w (wherein w represents one of the widths w1, w2 of the first and second semiconductor fins 110, 120, respectively) is at least 100 (1E2), at least 1,000 (1E3), or even at least 10,000 (1E4). According to one embodiment, w is between 50 nm (nanometers) and 100 nm, and 1 is between 500 nm and 10 μm (micrometers).

In the embodiment shown in FIG. 1, the semiconductor body 100 further includes a semiconductor layer 130 that adjoins the first and second semiconductor fins 110, 120 in a vertical direction z of the semiconductor body 100. The vertical direction z of the semiconductor body 100 is perpendicular to horizontal surfaces 101 of the first and second semiconductor fins 110, 120. In the embodiment shown in FIG. 1, the body region 13 of each transistor cell 10 is arranged in the semiconductor layer 130. In this specific embodiment, the semiconductor layer 130 includes one continuous semiconductor region that adjoins the first and second semiconductor fins 110, 120 of the individual transistor cells 10 and forms the body regions 13 of the individual transistor cells 10. In this embodiment, the gate electrode 21 is adjacent the body region 13 at the bottom of the trench, and is dielectrically insulated from the body region 13 by the gate dielectric 22 at the bottom of the trench.

In the embodiment shown in FIG. 1, the source region 11 extends from the first surface 101 down to the semiconductor layer 130 along a complete depth d of the first semiconductor fin 110, and a drain region 12 extends down from the first surface 101 to the semiconductor layer 130 along the complete depth d of the second semiconductor fin 120. According to one embodiment, the depth d is between 500 nm and 2,000 nm. However, this is only an example. Other embodiments are explained hereinbelow.

The individual transistor cells 10 are connected in parallel by having the source regions 11 electrically coupled to a common source terminal S, by having the drain regions 12 electrically coupled to a common drain terminal D, and by having the gate electrodes 21 electrically coupled to a common gate terminal G. The source, drain and gate terminals S, D, G are only schematically illustrated in FIG. 1. The power transistor schematically shown in FIGS. 1 and 2 can be implemented as an n-type transistor or as a p-type transistor. In an n-type transistor, the source region 11 and the drain region 12 are n-doped, while the body region 13 is p-doped, and in a p-type transistor, the source region 11 and the drain region 12 are p-doped, while the body region 13 is n-doped. Further, the transistor can be implemented as an enhancement transistor or as a depletion transistor. In an enhancement transistor, the body region 13 is doped complementary to the source region 11 and adjoins the gate dielectric 22. In a depletion transistor, there is a channel region (not shown) of the same doping type as the source region along the gate dielectric 22 and between the gate dielectric 22 and the body region 13.

The power transistor of FIGS. 1 and 2 can be operated like a conventional power transistor, in particular like a conventional power MOSFET. That is, the power transistor conducts a current, when a load voltage is applied between the drain and source terminals D, S, and when a drive potential is applied to the gate terminal G that generates a conducting channel (inversion channel) in the body region 13 between the first and second semiconductor fins 110, 120 in which the source and drain regions 11, 12, respectively, are integrated. In an n-type enhancement transistor, the drive potential that is to be applied to the gate terminal 21 in order to switch on the power transistor is a positive electrical potential relative to the source potential (the electrical potential of the source terminal S), and in a p-type enhancement transistor, the drive potential that is to be applied to the gate electrode 21 in order to switch on the power transistor is a negative electrical potential relative to the source potential.

The doping concentration of the source region 11 is, for example, in the range of between 1E18 and 1E21, the doping concentration of the drain region 12 is, for example, in the range of between 1E15 and 1E21, and the doping concentration of the body region 13 is, for example, in the range of between 1E14 and 1E17.

In the power transistor shown in FIGS. 1 and 2, the source regions 11, the drain regions 12 and the gate electrodes 21 are accessible via the first surface 101 of the semiconductor body 100, and, therefore, can be connected to the corresponding source, drain, and gate terminals S, D, G, respectively, in the region of the first surface 101. This provides several advantages. First, the semiconductor body 100 can be mounted to a heat sink at a second surface opposite the first surface 101. Further, the power transistor can easily be interconnected with other semiconductor devices that may be integrated in the same semiconductor body 100 (these other semiconductor devices are not shown in FIGS. 1 and 2).

The power transistor shown in FIGS. 1 and 2 is easy to scale. That is, the current rating of the power transistor can easily be adjusted by suitably selecting the number of transistor cells 10 when the power transistor is manufactured. According to one embodiment, the power transistor includes at least 100 (1E2), at least 1,000 (1E3), or even at least 10,000 (1E4) transistor cells.

In the power transistor of FIGS. 1 and 2, each transistor cell includes one gate electrode 21 that is arranged in a trench between the first and second semiconductor fins 110, 120, respectively. In this embodiment, two transistor cells share the first semiconductor fin 110. That is, the source regions 11 of two transistor cells are arranged in one first semiconductor fin 110. Equivalently, two transistor cells share one second semiconductor fin 120. That is, two neighboring transistor cells 10 have their drain regions 12 integrated in one second semiconductor fin 120.

While one transistor cell 10 only includes one first semiconductor fin 110, in which the source region 11 is integrated, and one second semiconductor fin 120, in which the drain region 12 is integrated, the overall power transistor includes a plurality of semiconductor fins that are spaced in a first lateral direction of the semiconductor body 100, and the semiconductor layer 130 adjoining the individual semiconductor fins 110, 120 in the vertical direction of the semiconductor body 100. The plurality of semiconductor fins are subdivided into a first group of first semiconductor fins 110 and a second group of second semiconductor fins 120. From a plurality of source regions 11, each source region 11 is arranged in one first semiconductor fin 110, and from a plurality of drain regions 12, each drain region is arranged in one second semiconductor fin 120.

Figure 3:
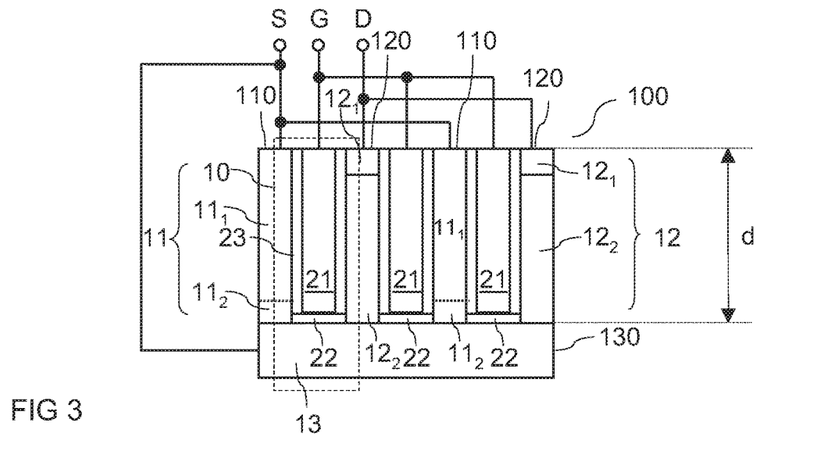
FIG. 3 illustrates a vertical cross sectional view of a power transistor according to a further embodiment.

The drain region 12 may have a substantially homogeneous doping concentration. According to a further embodiment, illustrated in FIG. 3, the drain region includes a first drain region section $12_1$ and a second drain region section $12_2$, wherein the second drain region section $12_2$ has a lower doping concentration than the first drain region section $12_1$. The second drain region section $12_2$ adjoins the body region 13, and the first drain region section $12_1$ is connected to the drain terminal D. The doping concentration of the first drain region section $12_1$ may correspond to the doping concentrations explained for the drain region 12 hereinbefore (between 1E18 cm$^{-3}$ and 1E21 cm$^{-3}$). The doping concentration of the second drain region section $12_2$ is, for example, in the range of between 1E14 cm$^{-3}$ and 1E18 cm$^{-3}$. The second drain region section $12_2$ may adjoin the first drain region section $12_1$ (as illustrated in FIG. 3). According to a further embodiment (not illustrated), a field-stop region of the same doping type as in the first and second drain region sections $12_1$, $12_2$ but higher doped than the second drain region section $12_2$ and lower doped than the first drain region section $12_1$ is arranged between the first drain region section $12_1$ and the second drain region section $12_2$.

According to one embodiment, the second drain region section $12_2$ has a substantially homogenous doping concentration. According to a further embodiment, the doping concentration of the second drain region section $12_2$ decreases towards the body region 13.

The second drain region section $12_2$ that adjoins the body region 13 helps to increase the voltage blocking capability of the power transistor, and can also be referred to as drain extension or drift region. The drift region $12_2$ adjoins the body region 13 and forms a pn junction with the body region 13. When the power transistor is switched off, that is, when a conducting channel in the body region 13 is interrupted, and when a load voltage is applied between the drain and source terminals D, S the pn junction between the body region 13 and the drift region $12_2$ is reverse biased, so that a depletion region (space charge region) expands in the drift region $12_2$. When the drift region $12_2$ is lower doped than the body region 13, the space charge region mainly expands in the drift region $12_2$, and the drift region $12_2$ mainly absorbs the load voltage applied between the drain and source terminals D, S.

Referring to FIG. 3, the source region 11 may include a first source region section $11_1$ coupled to the source terminal S, and a second source region section $11_2$ located between the first source region section $11_1$ and the body region 13, and adjoining the first source region section $11_1$ and the body region 13. The second source region section $11_2$ may include a monocrystalline semiconductor material and may have a doping concentration as explained above with reference to the source region 11 shown in FIGS. 1 and 2. The first source region section $11_1$ may include one of a monocrystalline semiconductor material and a polycrystalline semiconductor material with a doping concentration higher than the doping concentration of the second source region section $11_2$. According to another embodiment, the first source region section $11_1$ includes a metal, such as aluminum (Al), copper (Cu), tungsten (W), an alloy, or a metal-semiconductor compound, such as a silicide. In this case, the first semiconductor fin 110 only includes the second source region section $11_2$ while the first source region section $11_1$ including the metal is located above the semiconductor fin. According to one embodiment, a vertical dimension of the second source region $11_2$ section, which is a dimension in the vertical direction of the semiconductor body 100, is smaller than a vertical dimension of the first source region section $11_1$, which is a dimension in the vertical direction of the semiconductor body 100. According to one embodiment a ratio between the vertical dimension of the first source region section $11_1$ and the vertical dimension of the second source region section $11_2$ is higher than 5:1, higher than 10:1, or even higher than 20:1.

It should be noted that a drain region 12 with two drain region sections $12_1$, $12_2$, is not restricted to be used in the embodiment shown in FIG. 3, but may as well be implemented in each of the embodiments explained above and explained below. Equivalently, a source region 11 with two source region sections $11_1$, $11_2$, is not restricted to be used in the embodiment shown in FIG. 3, but may as well be implemented in each of the embodiments explained above and explained below.

The source terminal S is also connected to the body region 13 so that the pn junction between the body region 13 and the drift region $12_2$ is reverse biased when the power transistor is switched off. An electrical connection between the source terminal S and the body region 13 is only schematically illustrated in FIGS. 1 and 3.

In the embodiments shown in FIGS. 1 and 3, in which the body regions 13 of the individual transistor cells 10 are arranged in the semiconductor layer 130 between the first and second semiconductor fins 110, 120, the gate electrodes 21 are dielectrically insulated from the body regions 13 by the gate dielectrics 22, and are dielectrically insulated from the first and second semiconductor fins 110, 120 by insulation layers (dielectric layers) 23 along sidewalls of the semiconductor fins. In these embodiments, the gate electrodes 21 substantially extend along the complete depths d of the first and second semiconductor fins 110, 120. A gate-source capacitance of the power transistor, which is a capacitance between the gate electrodes 21 and the source regions 11, and a gate-drain capacitance on the power transistor, which is a capacitance between the gate electrodes 21 and the drain regions 12, can be adjusted by suitably selecting a thickness of the insulation layers 23 between the gate electrodes 21 and the first semiconductor fin 110, and the gate electrodes 21 and the second semiconductor fins 120, respectively.

Figure 4:
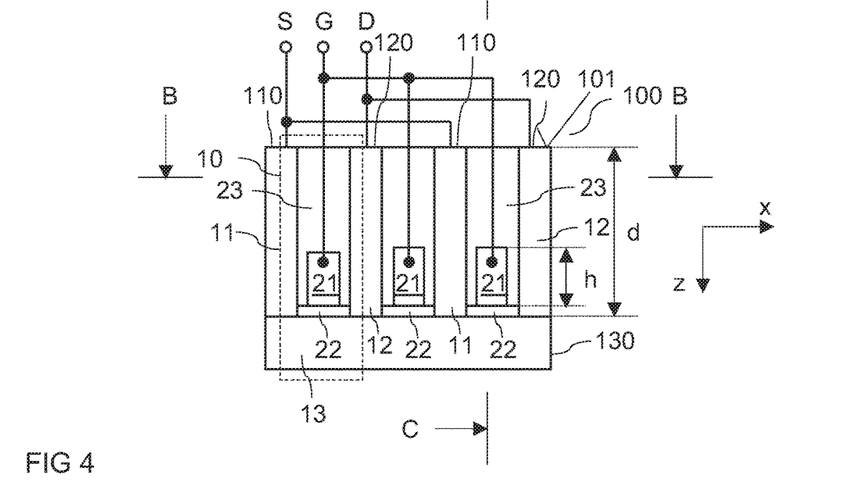
FIG. 4 illustrates a vertical cross sectional view of a power transistor according to a another embodiment.

Referring to FIG. 4, the gate-source capacitance and the gate-drain capacitance can be reduced by implementing the gate electrodes 21 such that the gate electrodes 21 are substantially located in bottom regions of the individual trenches, but do not extend along a complete depth d of the first and second semiconductor fins 120, respectively. According to one embodiment, a height h of the individual gate electrodes 21, which is a dimension of the individual gate electrodes 21 in the vertical direction z of the semiconductor body 100 is less than 50% of a depth (height) of the first and second semiconductor fins 110, 120.

Figure 5:
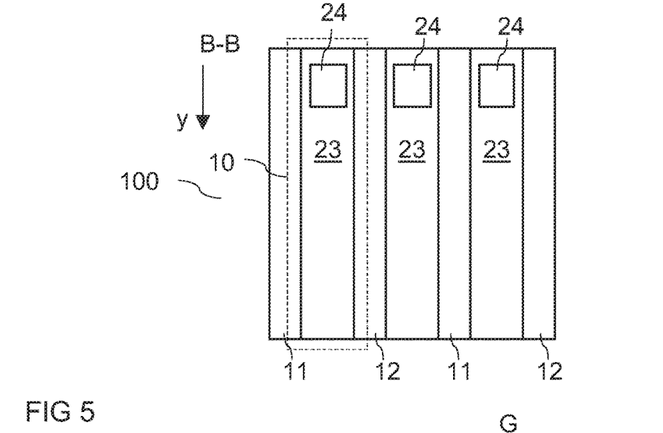
FIG. 5 illustrates a horizontal cross sectional view of the power transistor shown in FIG. 4.
Figure 6:
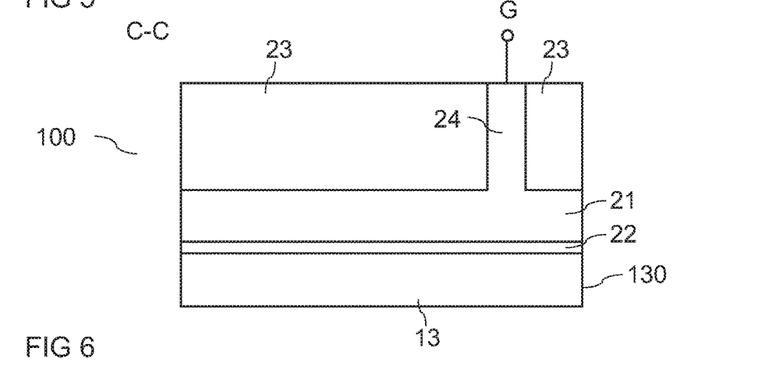
FIG. 6 illustrates a vertical cross sectional view of the power transistor shown in FIGS. 4 and 5 in another vertical section plane.

Referring to FIGS. 5 and 6 that show a horizontal sectional view of the power transistor in the horizontal section plane B-B, and a further vertical cross sectional view of the power transistor in a vertical section plane C-C, the individual gate electrodes 21, that are elongated in the second horizontal direction y each include one or more electrically conducting vias 24 that are dielectrically insulated from the first and second semiconductor fins 110, 120 by the insulation layer 23, and that extend to the first surface 101 where they can be electrically connected to the gate terminal G.

Figure 7:
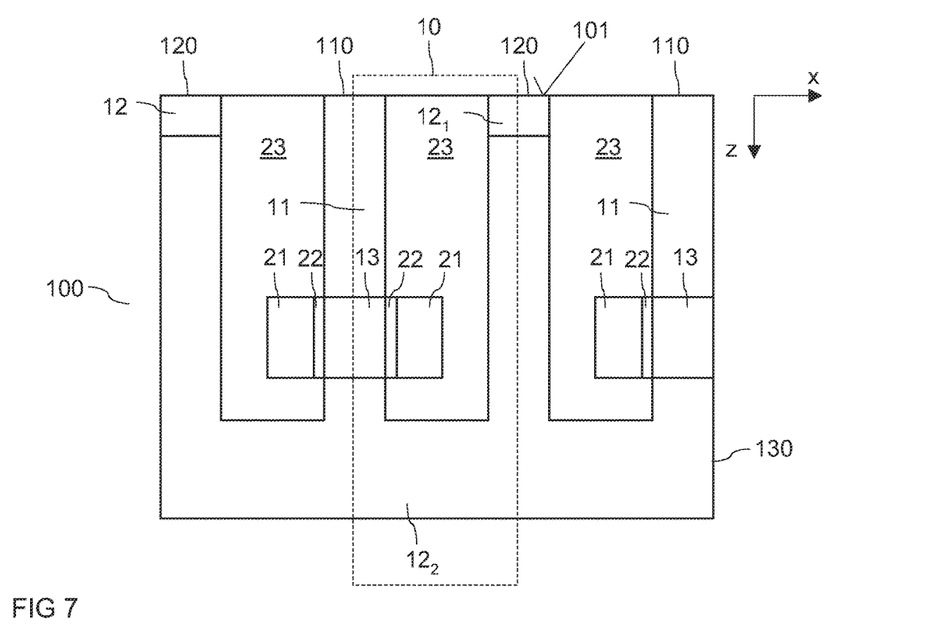
FIG. 7 illustrates a vertical cross sectional view of a power transistor according to another embodiment.

FIG. 7 shows a vertical cross sectional view of a power transistor according to a further embodiment. For the ease of illustration, the source, drain and gate terminals and their connections to the source regions 11, the drain regions 12, and the gate electrodes 21, respectively, are not illustrated in FIG. 7. Referring to FIG. 7, the body regions 13 of the individual transistor cells 10 are arranged in the first semiconductor fins 110. In the embodiment illustrated in FIG. 7, the body regions 13 are spaced apart from the semiconductor layer 130. However, this is only an example. The power transistor could also be implemented such that the body regions 13 are located at bottoms of the first semiconductor fins 110 and adjoining the semiconductor layer 130.

Referring to FIG. 7, the gate electrode 21 of each transistor cell 10 is adjacent a sidewall of the first semiconductor fin 110, is adjacent the body region 13 and is dielectrically insulated from the body region 13 by the gate dielectric 22. Referring to FIG. 7, the gate electrodes 21 of two neighboring transistor cells are located adjacent opposite sidewalls of the first semiconductor fin 110, so that two gate electrodes 21 are arranged opposite each other, and the body region 13 is arranged between the opposing gate electrodes 21.

Referring to FIG. 7, the drain region 12 of each transistor cell 10 may include a higher doped first drain region section $12_1$ in the second semiconductor fin 120 in the region of the first surface 101, and a lower doped second drain region section (drift region) $12_2$. In this embodiment, the drift region $12_2$ is arranged in the second semiconductor fin 120 below the first drain region section $12_1$, in the semiconductor layer 130 adjoining the first and second semiconductor fins 110, 120, and in the first semiconductor fin 110 below the body region 13 and adjoining the body region 13.

The explanation concerning the doping concentration of the individual semiconductor regions applies to the power transistor of FIG. 7 accordingly. Like the power transistors explained hereinbefore, the power transistor of FIG. 7 can be implemented as an enhancement transistor (enhancement MOSFET). In this case, the body region 13 has a doping concentration that is complementary to the doping concentration of the source region 11. According to another embodiment, the body region 13 has the same doping type as the source region 11 and the drift region $12_1$. In this case, the power transistor is a depletion transistor that can be switched off by applying a drive potential to the gate electrode 21 such that the gate electrode 21 or, more specifically, the two opposing gate electrodes 21 pinch off a conducting channel in the body region 13 between the source region 11 and the drift region $12_2$. In a depletion transistor, the body region 13 may also be connected to the source terminal S.

Figure 8:
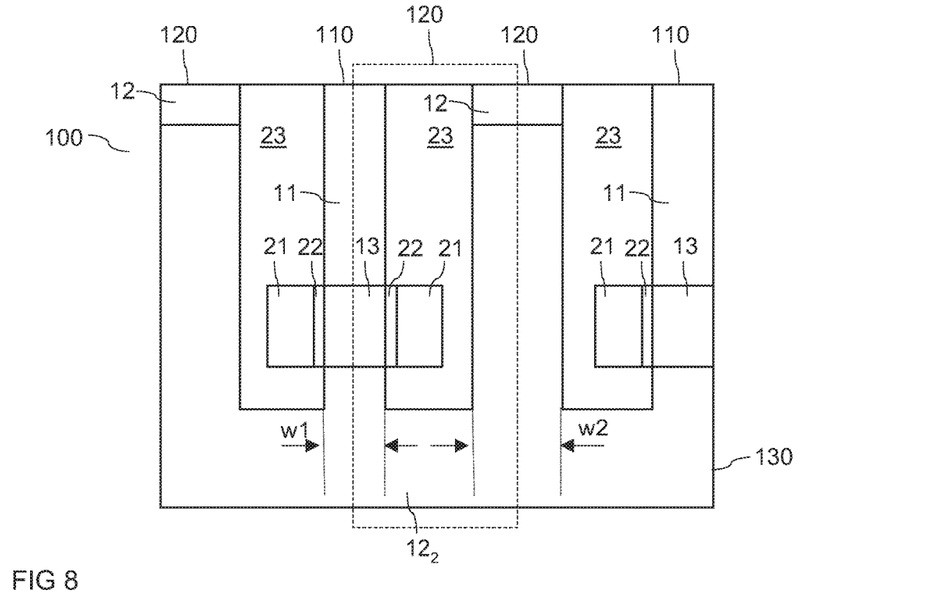
FIG. 8 illustrates a vertical cross sectional view of a power transistor according to another embodiment.

Referring to the explanation above, the second semiconductor fins 120 can be wider than the first semiconductor fins 110. This may help to reduce the on-resistance of the power transistor, in particular in those cases in which the drain region includes a lower doped second train region section $12_2$ (drift region). FIG. 8 shows a modification of the power transistor of FIG. 7 in which the second semiconductor fins 120 are wider than the first semiconductor fins 110. Of course, this can be applied to the transistor devices explained with reference to FIGS. 1 to 6 accordingly.

Figure 9:
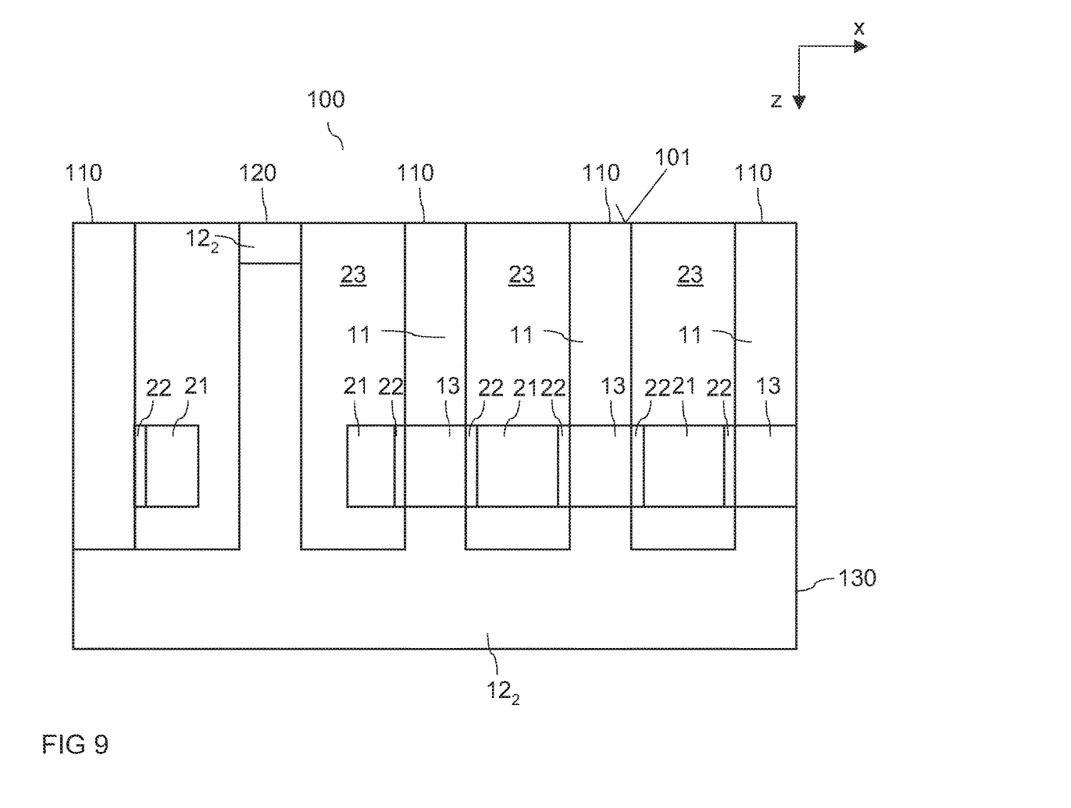
FIG. 9 illustrates a vertical cross sectional view of a power transistor according to yet another embodiment.

In the embodiments explained with reference to FIGS. 1 to 8 hereinbefore, the first semiconductor fins 110 and the second semiconductor fins 120 are arranged alternately in the first horizontal direction x of the semiconductor body 100. However, this is only an example. Especially in those embodiments, in which the body regions 13 are located in the first semiconductor fins 110, so that a section of the drain region is in the semiconductor layer 130 underneath the first and second semiconductor fins 110, 120, two or more first semiconductor fins 110 can be arranged subsequently in the first horizontal direction x. This is schematically illustrated in FIG. 9. In the embodiment of FIG. 9, two first semiconductor fins 110 are shown that are arranged subsequently in the first horizontal direction x. In the portion of the semiconductor body 100 shown in FIG. 9, there is one second semiconductor fin 120 including the second drain region section $12_2$ between two first semiconductor fins 110. However, this is only an example. According to a further embodiment, two or more second semiconductor fins 120 are arranged between two first semiconductor fins 110. Like in the embodiments explained hereinbefore, the second semiconductor fins 120 can be wider than the first semiconductor fins 110.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

What is claimed is:

1. A power transistor comprising:
a semiconductor body comprising a plurality of semiconductor fins that are spaced in a first lateral direction of the semiconductor body, and a semiconductor layer adjoining the semiconductor fins in a vertical direction of the semiconductor body, wherein the plurality of semiconductor fins comprises a first group of first semiconductor fins and a second group of second semiconductor fins, wherein a width of the second semiconductor fins of the second group is larger than a width of the first semiconductor fins of the first group;
a plurality of source regions, wherein each first semiconductor fin of the first group includes one of the plurality of source regions;
a plurality of drain regions, wherein each second semiconductor fin of the second group includes one of the plurality of drain regions;
a plurality of body regions, wherein each body region is arranged between one of the plurality of source regions and one of the plurality of drain regions;
a plurality of gate electrodes, wherein each gate electrode is arranged in a corresponding trench adjacent one of the first group of first semiconductor fins, is adjacent one of the plurality of body regions, and is dielectrically insulated from the one of the plurality of body regions by a gate dielectric;
a source node electrically coupled to each of the source regions;
a drain node electrically coupled to each of the drain regions; and
a gate node electrically coupled to each of the gate electrodes.

2. The power transistor of claim 1, wherein each of the plurality of body regions is arranged in the semiconductor layer.

3. The power transistor of claim 1, wherein each of the plurality of body regions is arranged in one of the first group of first semiconductor fins.

4. The power transistor of claim 1, wherein at least one of the drain regions comprises a first section coupled to the drain node and a second section lower doped than the first section and adjoining one of the plurality of body regions.

5. The power transistor of claim 4, wherein the first section and the second section have the same doping type.

6. The power transistor of claim 4, wherein the first section has a doping type that is complementary to a doping type of the second section.

7. The power transistor of claim 1, wherein at least one of the source regions comprises a first section coupled to the source node and a second section adjoining one of the plurality of body regions.

8. The power transistor of claim 7, wherein the second section of the source region comprises a monocrystalline semiconductor material, and wherein the first section of the source region comprises a material selected from the group consisting of:
a monocrystalline semiconductor material doped higher than the second section of the source region;
a polycrystalline semiconductor material doped higher than the second section of the source region;
a metal alloy; and
a metal-semiconductor compound.

9. The power transistor of claim 1, wherein the plurality of body regions have one of a doping type that is complementary to a doping type of the plurality of source regions, and a doping type corresponding to the doping type of the plurality of source regions.

10. The power transistor of claim 1, wherein each of the plurality of drain regions is partially arranged in the semiconductor layer.

11. The power transistor of claim 1,
wherein each of the plurality of semiconductor fins comprise a width in the first lateral direction of the semiconductor body, and a length in a second horizontal direction substantially perpendicular to the first lateral direction; and
wherein the length is larger than the width.

12. The power transistor of claim 11, wherein a ratio between the length and the width is at least 100:1.

13. The power transistor of claim 1, wherein a number of the plurality of semiconductor fins is at least 100.

14. The power transistor of claim 1, wherein the first semiconductor fins of the first group and the second semiconductor fins of the second group are arranged alternately in the first lateral direction.

15. A power transistor comprising a plurality of transistor cells, wherein each of the plurality of transistor cells comprises:
a source region arranged in a first semiconductor fin of a semiconductor body;
a drain region at least partially arranged in a second semiconductor fin of the semiconductor body, wherein the second semiconductor fin is spaced from the first semiconductor fin in a first horizontal direction of the semiconductor body, wherein
two of the plurality of transistor cells share one first semiconductor fin, and
two of the plurality of transistor cells share one second semiconductor fin;
a body region arranged between the source region and the drain region; and
a gate electrode, wherein the gate electrode is arranged in a trench adjacent the first semiconductor fin, is adjacent the body region, and is dielectrically insulated from the body region by a gate dielectric;
wherein each of the first and second semiconductor fins has a width in the first horizontal direction and a length in a second horizontal direction, wherein the length is larger than the width.

16. The power transistor of claim 15, further comprising:
a source terminal, a drain terminal, and a gate terminal,
wherein the source region of each of the plurality of transistor cells is coupled to the source terminal,
wherein the drain region of each of the plurality of transistor cells is coupled to the drain terminal, and
wherein the gate electrode of each of the plurality of transistor cells is coupled to the gate terminal.

17. The power transistor of claim 15, further comprising:
a semiconductor layer adjoining the first semiconductor fin and the second semiconductor fin in a vertical direction of the semiconductor body;
wherein the body region is arranged in the semiconductor layer.

18. The power transistor of claim 15, wherein the body region is arranged in the first semiconductor fin.

19. The power transistor of claim 15,
wherein the drain region comprises a first section, and a second section; and
wherein the second section is lower doped than the first section and adjoins the body region.

20. The power transistor of claim 19, wherein the first section and the second section have the same doping type.

21. The power transistor of claim 19, wherein the first section has a doping type that is complementary to a doping type of the second section.

22. The power transistor of claim 15, wherein the body region has one of a doping type that is complementary to a doping type of the source region, and a doping type corresponding to the doping type of the source region.

23. The power transistor of claim 15,
wherein the first semiconductor fin and the second semiconductor fin each comprises a width in the first horizontal direction of the semiconductor body, and a length in a second horizontal direction substantially perpendicular to the first horizontal direction; and
wherein the length is larger than the width.

24. The power transistor of claim 23, wherein a width of the second semiconductor fin is larger than a width of the first semiconductor fin.

25. The power transistor of claim 24, wherein a ratio between the length and the width is at least 100:1.

26. The power transistor of claim 15, wherein a number of the transistor cells is at least 100.

27. The power transistor of claim 15, further comprising:
a semiconductor layer adjoining the first semiconductor fin and the second semiconductor fin in a vertical direction of the semiconductor body,
wherein the drain region is partially arranged in the semiconductor layer.

28. A power transistor comprising a plurality of transistor cells, wherein each of the plurality of transistor cells comprises:
a source region arranged in a first semiconductor fin of a semiconductor body;
a drain region at least partially arranged in a second semiconductor fin of the semiconductor body, wherein the second semiconductor fin is spaced from the first semiconductor fin in a first horizontal direction of the semiconductor body;
a body region arranged between the source region and the drain region; and
a gate electrode, wherein the gate electrode is arranged in a trench adjacent the first semiconductor fin, is adjacent the body region, and is dielectrically insulated from the body region by a gate dielectric;
wherein each of the first and second semiconductor fins has a width in the first horizontal direction and a length in a second horizontal direction, wherein the length is larger than the width
wherein a width of the second semiconductor fin is larger than a width of the first semiconductor fin.

29. The power transistor of claim 28, further comprising:
a source terminal, a drain terminal, and a gate terminal,
wherein the source region of each of the plurality of transistor cells is coupled to the source terminal,
wherein the drain region of each of the plurality of transistor cells is coupled to the drain terminal, and
wherein the gate electrode of each of the plurality of transistor cells is coupled to the gate terminal.

30. The power transistor of claim 28, further comprising:
a semiconductor layer adjoining the first semiconductor fin and the second semiconductor fin in a vertical direction of the semiconductor body;
wherein the body region is arranged in the semiconductor layer.

31. The power transistor of claim 28, wherein the body region is arranged in the first semiconductor fin.

* * * * *